United States Patent
Jacob et al.

(10) Patent No.: US 12,198,325 B2
(45) Date of Patent: Jan. 14, 2025

(54) ML-ENABLED ASSURED MICROELECTRONICS MANUFACTURING: A TECHNIQUE TO MITIGATE HARDWARE TROJAN DETECTION

(71) Applicant: UNIVERSITY OF SOUTHERN CALIFORNIA, Los Angeles, CA (US)

(72) Inventors: Ajey Poovannummoottil Jacob, Los Angeles, CA (US); John Damoulakis, Los Angeles, CA (US); Akhilesh Jaiswal, Los Angeles, CA (US); Devanand Krishna Shenoy, Los Angeles, CA (US); Andrew Rittenbach, Fairfax, VA (US)

(73) Assignee: University of Southern California, Los Angeles, CA (US)

( * ) Notice: Subject to any disclaimer, the term of this patent is extended or adjusted under 35 U.S.C. 154(b) by 638 days.

(21) Appl. No.: 17/244,183

(22) Filed: Apr. 29, 2021

(65) Prior Publication Data
US 2021/0342991 A1  Nov. 4, 2021

Related U.S. Application Data

(60) Provisional application No. 63/017,572, filed on Apr. 29, 2020.

(51) Int. Cl.
*G06T 7/00* (2017.01)
*G06T 3/4046* (2024.01)
(Continued)

(52) U.S. Cl.
CPC ............ *G06T 7/001* (2013.01); *G06T 3/4046* (2013.01); *G06T 7/30* (2017.01); *G06T 11/003* (2013.01);
(Continued)

(58) Field of Classification Search
CPC ......... G06T 7/001; G06T 3/4046; G06T 7/30; G06T 11/003; G06T 2207/10061;
(Continued)

(56) References Cited

U.S. PATENT DOCUMENTS 6,452,677 B1 * 9/2002 Do .................. G01N 21/95684
977/773
2011/0002528 A1 * 1/2011 Bajura .................. G06T 7/001
382/145

(Continued)

OTHER PUBLICATIONS

F. Courbon, P. Loubet-Moundi, J. J. A. Fournier and A. Tria, "A high efficiency Hardware Trojan detection technique based on fast SEM imaging," 2015 Design, Automation & Test in Europe Conference & Exhibition (DATE), Grenoble, France, 2015, pp. 788-793, doi: 10.7873/DATE.2015.1104. (Year: 2015).*

(Continued)

*Primary Examiner* — Matthew C Bella
*Assistant Examiner* — Janice E. Vaz
(74) *Attorney, Agent, or Firm* — Brooks Kushman P.C.

(57) ABSTRACT

A method for assuring that integrated circuits are free of malicious circuit insertions and/or IC design modifications through mask swapping/addition is provided. The method includes a step of comparing 3D tomographic images constructed from design GDS to the 3D tomographic images constructed from in-line fab metrology data.

16 Claims, 9 Drawing Sheets

(51) Int. Cl.
*G06T 7/30* (2017.01)
*G06T 11/00* (2006.01)
*H01J 37/244* (2006.01)
*H01J 37/28* (2006.01)

(52) U.S. Cl.
CPC ............ *H01J 37/244* (2013.01); *H01J 37/28* (2013.01); *G06T 2207/10061* (2013.01); *G06T 2207/10072* (2013.01); *G06T 2207/20084* (2013.01); *G06T 2207/30148* (2013.01)

(58) Field of Classification Search
CPC . G06T 2207/10072; G06T 2207/20084; G06T 2207/30148; H01J 37/244; H01J 37/28
See application file for complete search history.

(56) References Cited

U.S. PATENT DOCUMENTS

| | | | | |
|---|---|---|---|---|
| 2017/0191945 | A1* | 7/2017 | Zhang | G06T 3/4053 |
| 2019/0328348 | A1* | 10/2019 | De Man | G06T 5/20 |
| 2020/0090325 | A1* | 3/2020 | Tehranipoor | G06T 7/0008 |
| 2020/0219827 | A1* | 7/2020 | Leobandung | G06F 21/73 |
| 2021/0134682 | A1* | 5/2021 | Leobandung | H01L 22/12 |
| 2021/0158498 | A1* | 5/2021 | Saraswatula | G06T 7/0008 |
| 2022/0137503 | A1* | 5/2022 | Tao | G06N 3/08 |
| | | | | 716/53 |
| 2023/0129202 | A1* | 4/2023 | Weiss | G06N 3/08 |
| | | | | 382/150 |

OTHER PUBLICATIONS

V. Lempitsky, A. Vedaldi and D. Ulyanov, "Deep Image Prior," 2018 IEEE/CVF Conference on Computer Vision and Pattern Recognition, Salt Lake City, UT, USA, 2018, pp. 9446-9454, doi: 10.1109/CVPR.2018.00984. (Year: 2018).*

Rosebrock, A. "How-To: Python Compare Two Images" (related to Mean Squared Error Equation, www.pyimagesearch.com/2014/09/15/python-compare-two-images/, last updated Jul. 1, 2021, 87 pgs.

Wang, Z. et al., "Image quality assessment: from error visibility to structural similarity," IEEE Transactions on Image Processing, vol. 13, No. 4, pp. 600-612, Apr. 2004, pp. 600-612.

Bychkov, D. et al., "Deep learning based tissue analysis predicts outcome in colorectal cancer," Scientific Reports, 8:3395 (2018), pp. 1-11.

* cited by examiner

1x

2x

3x

ML-ENABLED ASSURED MICROELECTRONICS MANUFACTURING: A TECHNIQUE TO MITIGATE HARDWARE TROJAN DETECTION

CROSS-REFERENCE TO RELATED APPLICATIONS

This application claims the benefit of U.S. provisional application Ser. No. 63/017,572 filed Apr. 29, 2020, the disclosure of which is hereby incorporated in its entirety by reference herein.

TECHNICAL FIELD

In at least one aspect, the present invention relates to a method and devices for mitigating hardware trojan detection.

BACKGROUND

GDSII refers to a binary database file format that is the industry standard for data exchange of integrated circuit or IC layout artwork. GDSII can represent text labels, planar geometric shapes, and other information about the layout in hierarchical form. The data is used to re-construct all or part of the artwork to be used in sharing services such as MPC and MPW. Hardware Trojans are known to contaminate the integrated circuit fabrication process resulting in considerable economic loss.

Accordingly, there is a need for methods and systems for detecting hardware trojan before they cause harm to a device.

SUMMARY

In at least one aspect, a method for assuring that integrated circuits are free of malicious circuit insertions and/or IC design modifications through mask swapping/addition is provided. The method includes a step of comparing 3D tomographic images constructed from design GDS to the 3D tomographic images constructed from in-line fab metrology data.

In another aspect, a method for assuring that an integrated circuit is free of malicious circuit insertions and/or IC design modifications is provided. The method includes steps of constructing a first set of one or more tomographic images constructed from design GDS for an integrated circuit layer or layers and constructing a second set of one or more tomographic images from in-line fab metrology data for the integrated circuit layer or layers. Corresponding images from first set of one or more tomographic images and the second set of one or more tomographic images are compared to detect malicious circuit insertions and/or IC design modifications to the integrated circuit where corresponding imaging being images of the same integrated circuit region. Characteristically, the presence of detected malicious circuit insertions and/or IC design are indicated by one or more differences between the corresponding images.

In another aspect, the resolution for images in the first set of one or more tomographic images and/or images in the second set of one or more tomographic images are upscaled.

In another aspect, the resolution for images in the first set of one or more tomographic images and/or images in the second set of one or more tomographic images are upscaled by a trained neural network.

In another aspect, missing regions in images in the first set of one or more tomographic images and/or images in the second set of one or more tomographic images are filled in by a trained neural network. The missing piece of information can be within a planar layer or a part of the 3D layer.

In another aspect, the in-line fab metrology data includes SEM data, and in particular, CDSEM data.

In another aspect, machine learning algorithms are applied to register tomographic 3D images.

In another aspect, an approach assuring that integrated circuits (IC), manufactured in any advanced worldwide foundry, are free of malicious circuit insertions and/or IC design modifications through mask swapping/addition (e.g., Embedded Trojans, intentionally induced manufacturing defects, circuit alterations, etc.) is provided.

In another aspect, the method focuses on IC fabrication (mask house and foundry). In this regard, the research needs sections 4.1 and 4.5 from the SRC hardware security document are addressed.

In another aspect, the method provides a non-destructive high throughput cost-effective manufacturing friendly method to detect hardware trojan circuits using an ML-enabled smart tomographic technique.

In another aspect, the method compares 3D tomographic GDS images obtained from in-line metrology techniques to the data obtained from on record 3D tomographic GDS created during the chip design.

In another aspect, an approach assuring that integrated circuits (ICs), manufactured in any advanced worldwide foundry, are free of malicious circuit insertions and/or IC design modifications (e.g., embedded Trojans, intentionally induced manufacturing defects, circuit alterations, etc.).

In another aspect, methods are presented to remedy the potential threat vulnerabilities encountered after the IC's original GDS design file (assumed to be trusted) is delivered to mask house and/or foundry.

In another aspect, a method applying a wafer-acceptance-criteria is provided. The wafer-acceptance-criteria is determined by comparing and validating 2D tomographic images constructed from design GDS to the 2D tomographic images constructed from the in-line fab metrology data. Besides, USC/ISI has also elucidated novel solutions for comparing 3D tomographic images.

BRIEF DESCRIPTION OF THE DRAWINGS

For a further understanding of the nature, objects, and advantages of the present disclosure, reference should be had to the following detailed description, read in conjunction with the following drawings, wherein like reference numerals denote like elements and wherein:

FIGS. 2B-1, 2B-2, 2B-3, and 2B-4. SEM micrographs illustrating super-resolution enhancement for 1×, 2×, 3×, and 4× resolution upscaling.

FIG. 3. Flowchart depicting the combination of super image enhancement with generative image stitching in creating suitable images for Trojan detection.

FIG. 4. Plots of scan times for single and multibeam SEM with and without image enhancement.

DETAILED DESCRIPTION

Figure 1:
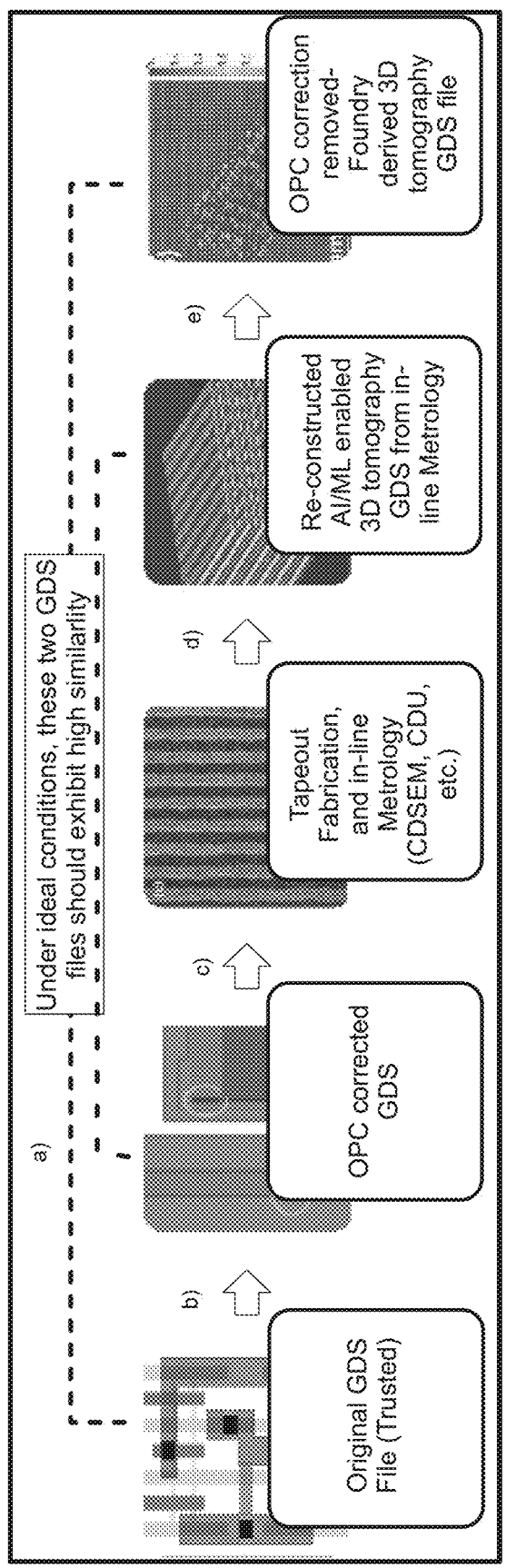
FIG. 1. Depicts the schematics of the proposed Hardware Trojan detection from the IC fabrication ecosystem.

Reference will now be made in detail to presently preferred embodiments and methods of the present invention, which constitute the best modes of practicing the invention presently known to the inventors. The Figures are not necessarily to scale. However, it is to be understood that the disclosed embodiments are merely exemplary of the invention that may be embodied in various and alternative forms. Therefore, specific details disclosed herein are not to be interpreted as limiting, but merely as a representative basis for any aspect of the invention and/or as a representative basis for teaching one skilled in the art to variously employ the present invention.

It is also to be understood that this invention is not limited to the specific embodiments and methods described below, as specific components and/or conditions may, of course, vary. Furthermore, the terminology used herein is used only for the purpose of describing particular embodiments of the present invention and is not intended to be limiting in any way.

It must also be noted that, as used in the specification and the appended claims, the singular form "a," "an," and "the" comprise plural referents unless the context clearly indicates otherwise. For example, reference to a component in the singular is intended to comprise a plurality of components.

The term "comprising" is synonymous with "including," "having," "containing," or "characterized by." These terms are inclusive and open-ended and do not exclude additional, unrecited elements or method steps.

The phrase "consisting of" excludes any element, step, or ingredient not specified in the claim. When this phrase appears in a clause of the body of a claim, rather than immediately following the preamble, it limits only the element set forth in that clause; other elements are not excluded from the claim as a whole.

The phrase "consisting essentially of" limits the scope of a claim to the specified materials or steps, plus those that do not materially affect the basic and novel characteristic(s) of the claimed subject matter.

With respect to the terms "comprising," "consisting of," and "consisting essentially of," where one of these three terms is used herein, the presently disclosed and claimed subject matter can include the use of either of the other two terms.

It should also be appreciated that integer ranges explicitly include all intervening integers. For example, the integer range 1-10 explicitly includes 1, 2, 3, 4, 5, 6, 7, 8, 9, and 10. Similarly, the range 1 to 100 includes 1, 2, 3, 4 . . . 97, 98, 99, 100. Similarly, when any range is called for, intervening numbers that are increments of the difference between the upper limit and the lower limit divided by 10 can be taken as alternative upper or lower limits. For example, if the range is 1.1. to 2.1 the following numbers 1.2, 1.3, 1.4, 1.5, 1.6, 1.7, 1.8, 1.9, and 2.0 can be selected as lower or upper limits.

The term "connected to" means that the electrical components referred to as connected to are in electrical communication. In a refinement, "connected to" means that the electrical components referred to as connected to are directly wired to each other. In another refinement, "connected to" means that the electrical components communicate wirelessly or by a combination of wired and wirelessly connected components. In another refinement, "connected to" means that one or more additional electrical components are interposed between the electrical components referred to as connected to with an electrical signal from an originating component being processed (e.g., filtered, amplified, modulated, rectified, attenuated, summed, subtracted, etc.) before being received to the component connected thereto.

The term "electrical communication" means that an electrical signal is either directly or indirectly sent from an originating electronic device to a receiving electrical device. Indirect electrical communication can involve processing of the electrical signal, including but not limited to, filtering of the signal, amplification of the signal, rectification of the signal, modulation of the signal, attenuation of the signal, adding of the signal with another signal, subtracting the signal from another signal, subtracting another signal from the signal, and the like. Electrical communication can be accomplished with wired components, wirelessly connected components, or a combination thereof.

The term "one or more" means "at least one" and the term "at least one" means "one or more." The terms "one or more" and "at least one" include "plurality" as a subset.

The term "substantially," "generally," or "about" may be used herein to describe disclosed or claimed embodiments. The term "substantially" may modify a value or relative characteristic disclosed or claimed in the present disclosure. In such instances, "substantially" may signify that the value or relative characteristic it modifies is within ±0%, 0.1%, 0.5%, 1%, 2%, 3%, 4%, 5% or 10% of the value or relative characteristic.

The term "electronic component" refers to any physical entity in an electronic device or system used to affect electron states, electron flow, or the electric fields associated with the electrons. Examples of electronic components include, but are not limited to, capacitors, inductors, resistors, thyristors, diodes, transistors, etc. Electronic components can be passive or active.

The term "electronic device" or "system" refers to a physical entity formed from one or more electronic components to perform a predetermined function on an electrical signal.

It should be appreciated that in any figures for electronic devices, a series of electronic components connected by lines (e.g., wires) indicates that such electronic components are in electrical communication with each other. Moreover, when lines directed connect one electronic component to another, these electronic components can be connected to each other as defined above.

Throughout this application, where publications are referenced, the disclosures of these publications in their entireties are hereby incorporated by reference into this application to more fully describe the state of the art to which this invention pertains.

The term "hardware trojan" refers to any malicious modification of the circuitry of an integrated circuit or the inclusion of a malicious component therein.

Abbreviations

"CD-SEM" means critical dimension scanning electron microscope.
"EDA" means electronic design automation.
"FOV" means field of view.
"GDS" means graphic database system.
"IC" means integrated circuits.

"ML" means machine learning.
"MPC" means multi-project chip.
"MPW" means multi-project wafer.
"OPC" means optical proximity correction.
"PDK" means process design kit.
"RNN" means recurrent neural network.
"STI" means shallow trench isolation.

Referring to FIG. 1, a flowchart for a method for assuring that integrated circuits are free of malicious circuit insertions and/or IC design modifications is provided. In a refinement, these malicious circuit insertions and/or IC design modifications occur through mask swapping or addition. The method includes a step a) of comparing 2D and/or 3D tomographic images constructed from design (i.e., original) GDS to the 2D and/or 3D tomographic images constructed from the in-line fab metrology data. Typically, GDS is GDSII. In a refinement, the in-line fab metrology data is acquired during the time of manufacturing the integrated circuit. As depicted in step b), an OPC corrected GDS is created. As depicted in step c), during each step of the IC fabrication flow, several in-line metrology measurement steps (such as CDSEM) are taken layer-by-layer that can be used to create the 2D tomographic image of each IC layer and the 3D composite tomographic image of entire IC. An OPC corrected OPC-modified GDS file of the entire IC, or of a specific layer of an IC, can be constructed from these measurements. In step d), a re-constructed an AWL-enabled 3D tomography GDS can be created from in-line metrology. In step e), the OPC correction is removed to create a foundry-derived 3D tomography GDS file. The wafer acceptance criteria require to match both 3D GDS images (e.g., the 3D composite tomographic image and the 3D image created from the in-line fab metrology data). The 3D tomographic image helps enhanced visualization for all IC layers and their routing. Moreover, the 3D tomographic images can facilitate the detailed examination of a suspicious area-of-interest. This is particularly useful for MPC and MPW services that might be susceptible to including of malicious Trojans.

In one variation, the design 3D tomographic image of an IC layer and a 3D tomographic image for the same IC layer can be compared. In another variation, the design 2D tomographic image of an IC layer and a 2D tomographic image for the same IC layer can be compared. This comparison is typically performed for a plurality of IC layers. In a refinement, a wafer is accepted from the fab line if the 3D composite tomographic image matches the 3D tomographic images constructed from in-line fab metrology data or if the 2D composite tomographic image(s) matches the 2D tomographic images.

The fab process in which the method for detecting malicious circuit insertions and/or IC design modifications can be utilized includes numerous steps. Fab steps include, but are not limited to, reticle layout, frame generation, data fracturing, resist application and etching, metrology, defect inspection and repair, mask and pellicle-related operations, wafer processing, and the like. It should be appreciated that any of the processing steps can be susceptible to a malicious attack. However, the greatest vulnerability is during mask generation and the uses thereof. Specific malicious attacks can be mask swapping and/or mask addition. Examples of monitored measured parameters for a fab line for an integrated circuit includes, but is not limited to, fin fin width, side and wall angles, side and wall roughness, pitch, STI width, doping, total and active fin height, source/drain recess, in source-d: fin recess and STI recess, source-drain lateral profile, poly pitch, metal gate length, gate metal to contact spacing, gate dielectric thickness, gate work function metal, and the like.

The 2D tomographic images and 3D tomographic image images used in the method can be generated by any number of imaging techniques. Examples of imaging techniques include, but are not limited to, data generated by CDSEM tools, CD Uniformity tools, and e-beam imaging tools. While the e-beam tool has a continuous and higher throughput possibility, it requires a very high memory storage requirement. The current e-beam and CD Uniformity tools are more of a development tool than the CDSEM tools used in the fab. For this reason and the reasons set forth below, CDSEM are found to be the most practical.

In a variation, several in-line metrology measurements are taken layer-by-layer and used to create 2D tomographic images of each IC layer during each step of IC fabrication flow. In a refinement, a 3D composite tomographic image of an entire IC is formed from the 2D tomographic images. Advantageously, the composite 3D tomographic image enhances visualization for all IC layers and their routing. It should also be appreciated that the composite 3D tomographic image facilitates a detailed examination of a suspicious area-of-interest. In a refinement, an OPC-modified GDS file of the entire IC are constructed from the metrology measurements. Moreover, an OPC-modified GDS file of a specific layer in an IC is constructed from the metrology measurements. Typically, a wafer is accepted if the 3D composite tomographic image matches the 3D tomographic image constructed from in-line fab metrology data.

In a variation, the in-line fab metrology data is obtained from scanning electron microscopy, and in particular, CDSEM, which is used to create 2D images at various stages of the integrated circuit process. Table 1 provides scan time estimates for SEM scans with and without super-resolution and lateral image stitching (see, description below). Standard SEM imaging for ICs is capable of imaging a 10 µm×10 µm region in approximately one second. At this rate, it would take nearly two weeks to scan a 1 cm×1 cm region. To increase SEM imaging throughput, a combination of hardware and deep learning-based image processing to enable imaging of cm-scale regions (e.g., 0.1 to 5 cm) in a reasonable amount of time is utilized. In this regard, any combination or all of the following techniques are applied: multibeam SEM imaging, super-resolution image enhancement, and image stitching (where a trained generator neural network makes a prediction as to how to fill in a region of the image that was not scanned). An analysis of the potential throughput enhancement showed that even with conservative estimates, a speedup of 480× over standard single beam imaging is attainable. This estimate assumes a 90× speedup due to multibeam imaging, a 4× speedup for super-resolution image processing, and an additional 1.33× speedup due to image stitching. The speedup due to super-resolution enhancement assumes only 2× resolution enhancement (although greater enhancement is feasible) and image stitching filling in 25% of the image, i.e., only 75% of the IC scan region is scanned. Therefore, it is determined that SEM images of an entire IC layer can be taken and used for trojan detection/fault analysis.

TABLE 1

SEM Scan times

| Approach | Speedup over baseline | Time to scan 1 mm × 1 mm | Time to scan 1 cm × 1 cm | Time to scan 3 cm × 3 cm |
|---|---|---|---|---|
| Single Beam SEM | 1x | 10000 seconds (2.7 hours) | 1000000 seconds (11.5 days) | 9000000 seconds (104 days) |
| Single Beam SEM + SR | 4x | 2500 seconds (0.67 hours) | 250000 seconds (2.89 days) | 2250000 seconds (26 days) |
| Single Beam SEM + SR + IS | 5.3x | 1886 seconds (0.52 hours) | 188680 seconds (2.18 days) | 1698113 seconds (19.6 days) |
| Multi Beam SEM + SR | 360x | 27 seconds | 2778 seconds (0.77 hours) | 25000 seconds (6.9 hours) |
| Multibeam SEM + SR + IS | 480x | 20.8 seconds | 2083 seconds (.57 hours) | 18750 seconds (5.2 hours) |

SR = super-resolution
IS = lateral image stitching

In refinement, multibeam SEM imaging is applied in order to increase throughput. Multibeam SEM imaging is able to achieve image acquisitions greater than terapixel per hour. Currently, the Carl Zeiss Multi-SEM tool is the fastest SEM available. The Carl Zeiss Multi-SEM tool has 91 parallel electron beams such that imaging can be done on the centimeter scale at nanometer resolution. This unique SEM is capable of continuous operation and is suitable for advanced manufacturing. It has a high data acquisition workflow, and the data can be acquired automatically as in currently available SEMs.

Figure 2A:
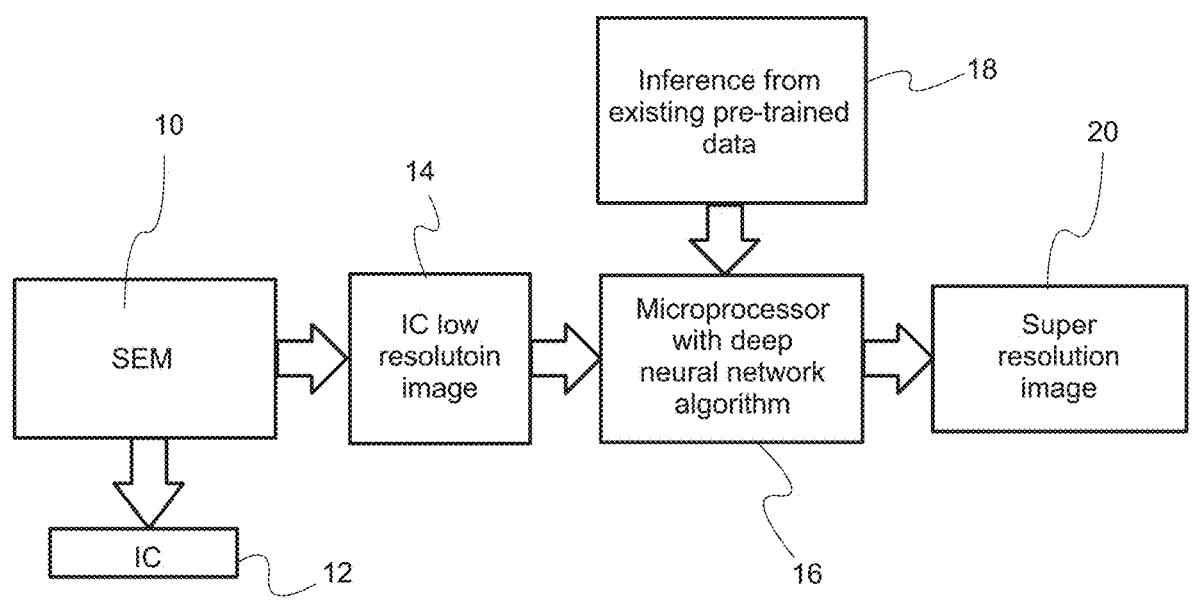
FIG. 2A. Flowchart depicting super-resolution enhancement.
Figures 1, 2B:
Figures 2, 2B:
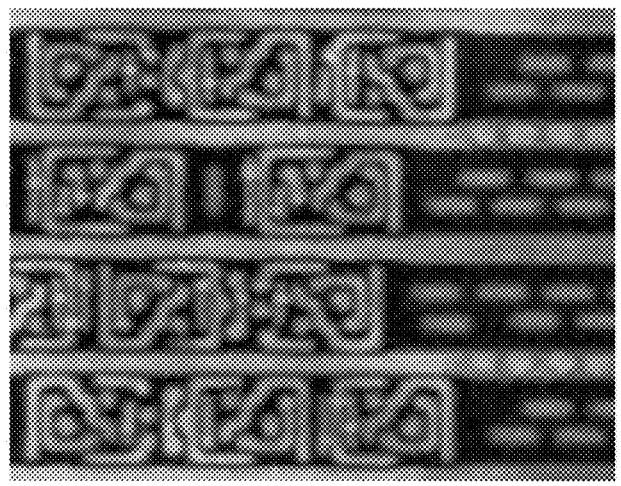

Referring to FIG. 2A, a flowchart illustrating super-resolution image enhancement is provided. Super-resolution refers to the upscaling of an image's resolution by a trained neural network. SEM 10 is used to obtain SEM image data from an integrated circuit 12. Low resolution image 14 is created from this data. Microprocessor system 16 receives Low resolution image 14 and an inference from existing pre-trained data. Microprocessor system 16 outputs super resolution image 20. The neural network used by microprocessor system 16 is trained to build a mapping from low resolution to high resolution image. In particular, the training data for the neural network can include pair of experimentally measured low resolution images and high resolution images. The resolution of the low resolution image is lower than the high resolution image. The trained network can be used for inference in which low resolution images are input to the network and higher resolution images are generated as output. Alternatively expressed, the trained neural network for resolution enhancement receives a low resolution image as input and outputs an image where the resolution is upscaled compared to the resolution of the low resolution image. There are several benefits associated with super-resolution imaging. The super resolution image enhancement can be performed by GPU enabled hardware which is now generally available. Moreover, image enhancement can be performed essentially in real-time as data is collected. When applied to SEM imaging, super-resolution image enhancement enables an increase in throughput. For example, each 2× improvement in resolution corresponds to a 4× improvement in throughput. As set forth below, when used in conjunction with a complete hardware/software solution, sub-nm to nm scale image resolution on cm-scale images can be acquired in a few hours. FIGS. 2B-1, 2B-2, 2B-3, and 2B-4 illustrate super resolution enhancement for SEM images resolved at 2×, 3×, and 4× compared to a 1× image (i.e., no resolution enhancement). These enhanced images were generated from publicly available deep neural networks designed for super-resolution and sample SEM IC images from an internal dataset. (learnopencv.com/super-resolution-in-opencv/)

In a variation, generative adversarial network style training is used to fine tune the super resolution networks. This approach has been shown to enable higher quality resolution enhancement when compared with deep neural networks trained using more standard loss functions such as mean absolute error or mean squared error. When training super resolution networks, if these loss functions are used, in many cases the network will ultimately produce an image that is an average of possible solutions. Visually, this may result in a blurred image. If adversarial training is used, when training the deep neural network for super resolution, the loss function consists of two components: the standard component (e.g., mean absolute error or mean squared error) as well as an adversarial component that is generated by a separate deep neural network that is trained alongside the network to discriminate between upscaled images produced by the super resolution network and imagery that was collected at high resolution. Adversarial loss is minimized when this second network cannot distinguish between images produced by the super resolution network and images natively acquired at high resolution. The inclusion of adversarial loss when training the super resolution network is ultimately what enables the network to generate higher quality imagery when compared with networks trained using standard loss functions.

Figures 2, 2B, 3:
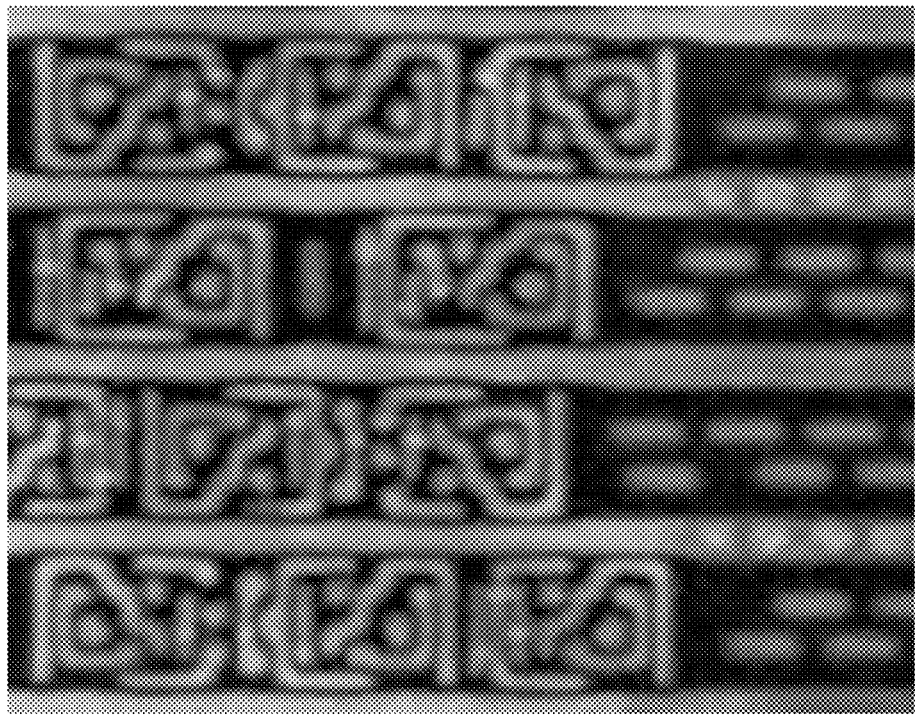

FIG. 3 provides a flowchart depicting the combination of super image enhancement with generative image stitching in creating suitable images for Trojan detection. In this variation, microprocessor system 16 receives an input image 30 having a low image resolution and a missing region 32. microprocessor system 16 implements algorithms for a deep neural network for super-resolution enhancement and generative image stitching to output a super solution enhanced image 34 with the missing region filled in. The imaging stitching can be lateral or volumetric. Lateral image stitching is defined as Image stitching using a trained network to 'fill in' missing portion of SEM image in a lateral plane. Image stitching applies a trained neural network to 'fill in' missing portions of SEM images. In a refinement, generative image stitching in which a trained neural network takes an image with the missing region and performs inference to fill in the missing region is applied for this purpose. In a variation, volume image stitching uses a trained network to 'fill in" the missing portion of the volume image. In this variation, 2D images from SEM measurement are stacked with the space between adjacent layers filled in by the stitching technique. Alternatively, each individual layer can be replicated by a number equal to the layer thickness divided by the volumetric image voxel size. The replicated layer data is then placed in the appropriate space along the z-axis of the volumetric image.

In a further refinement, super-resolution image enhancement from a scan's low resolution over entire FOV and use trained network to improve image resolution. The neural networks for the 2D and 3D image stitching can include pairs of images that include one of the whole image and one with a portion of the same image removed. The removed portions can be randomly selected, periodically selected from the image, or selected by a user.

Figures 2, 2B, 3, 4:
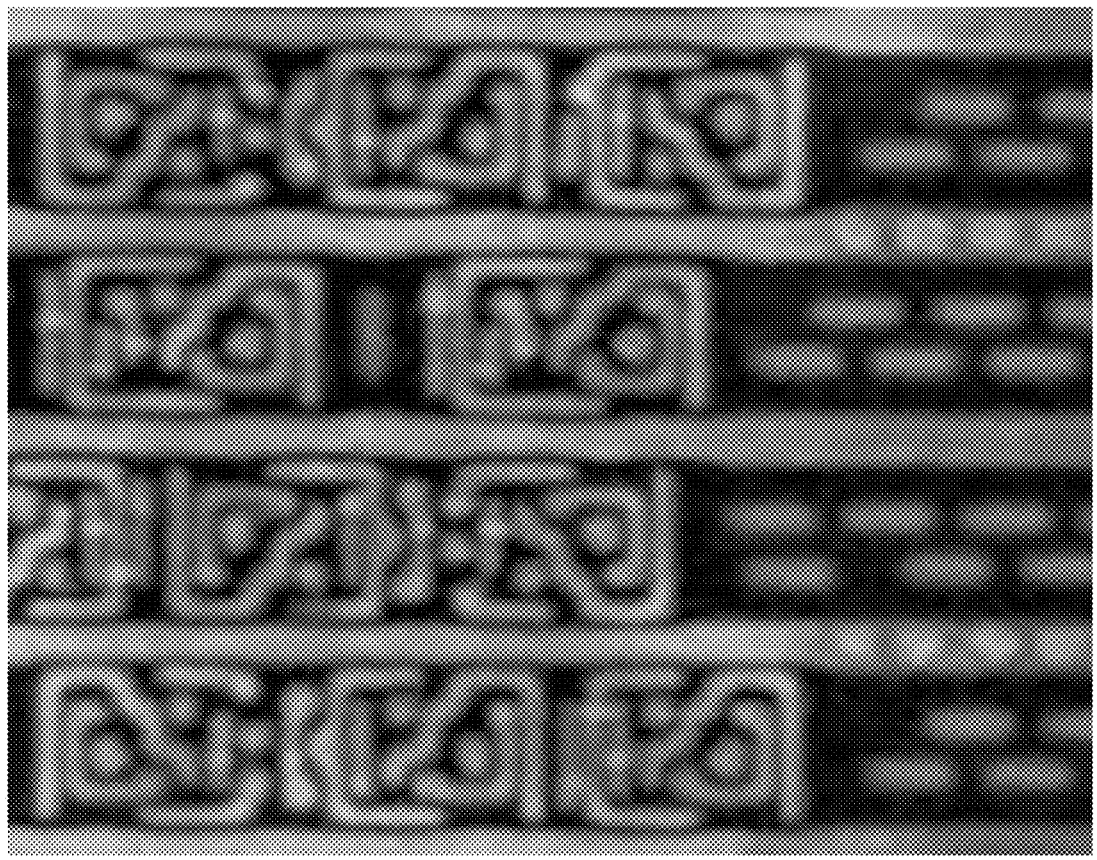
Figure 3:
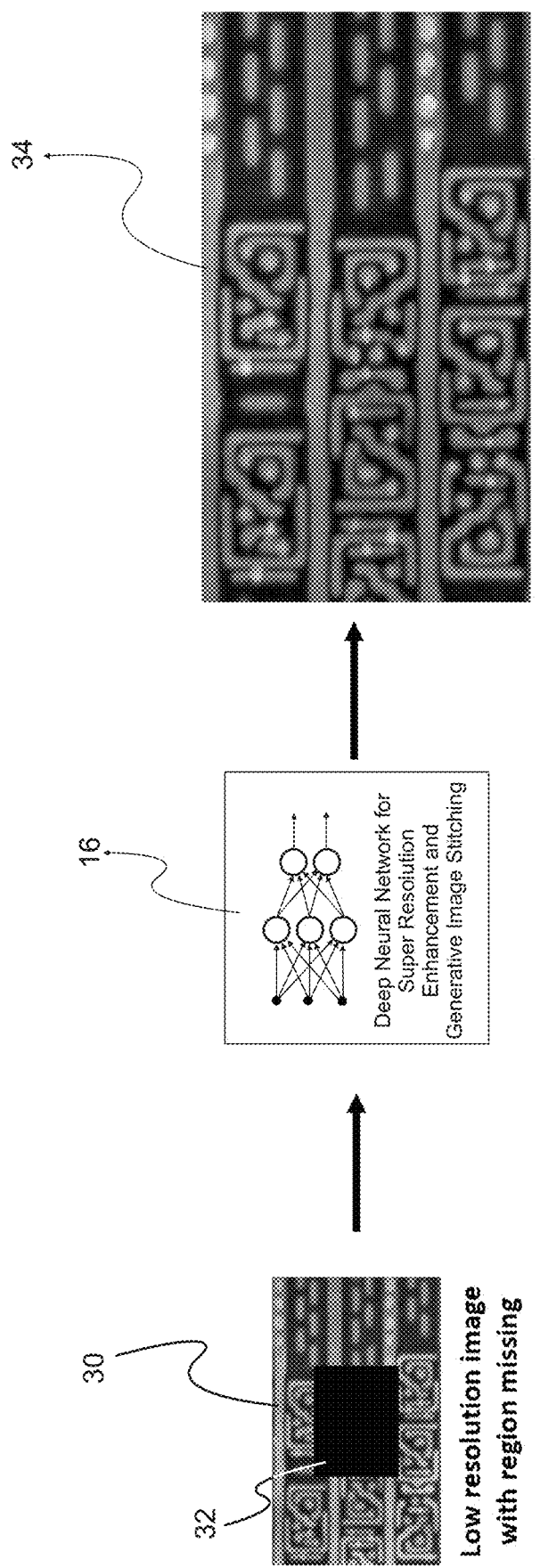
Figure 4:
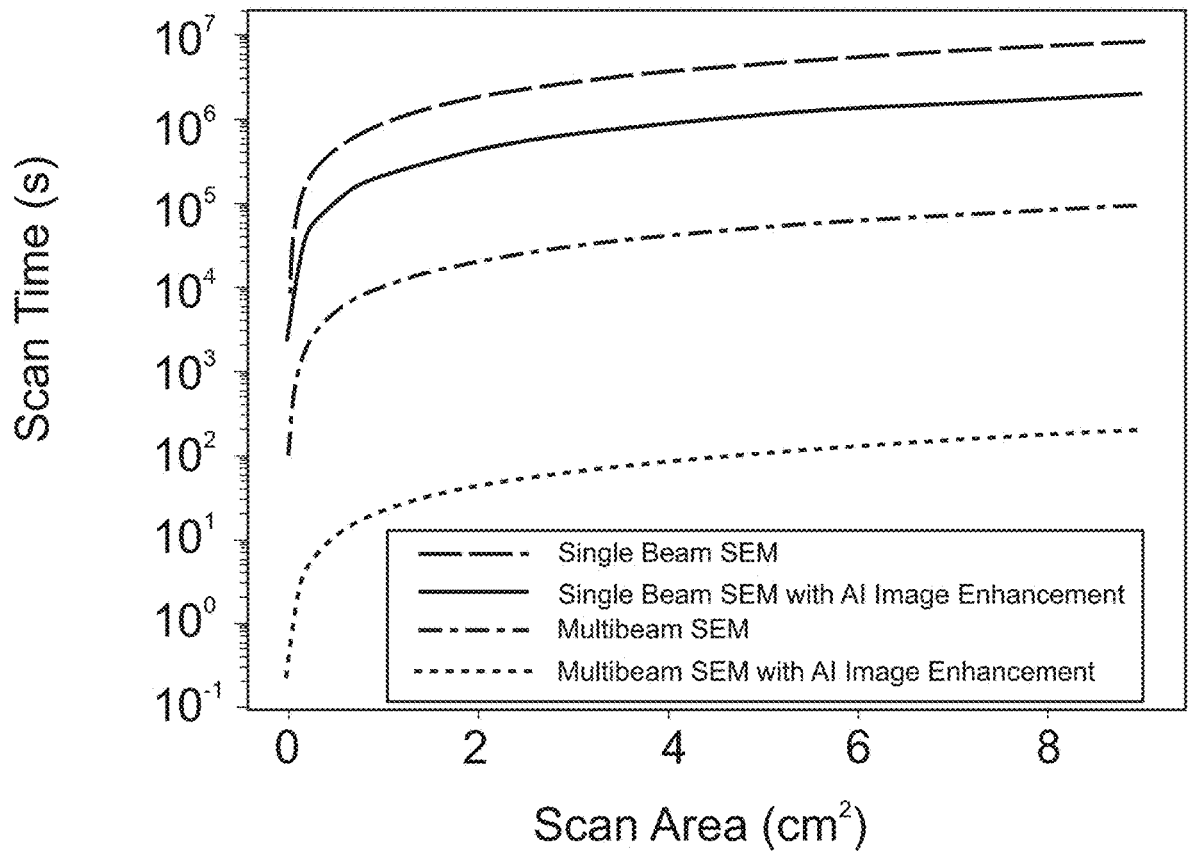

A combination of the above techniques (e.g., multibeam CDDEM, super-resolution enhancement, and image stitching) can improve the throughput useful for manufacturable process improvements. In this regard, FIG. 4 provides plots of scan times for single and multi-beam SEM with and without image enhancement. FIG. 4 shows that super-resolution and image stitching approach enables SEM imaging of cm scale regions in hours instead of days.

Figure 5:
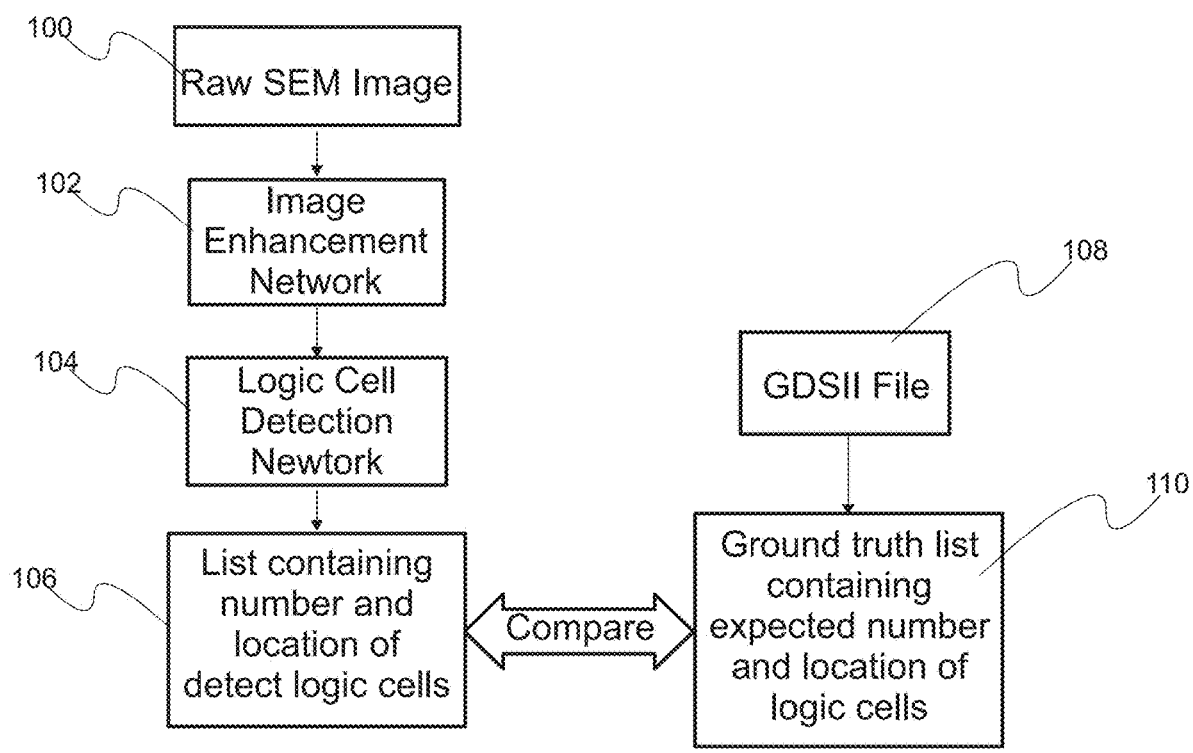
FIG. 5. Flowchart depicting the application of SEM imaging and deep learning-based techniques for fault or trojan detection.

With reference to FIG. 5, a flowchart depicting the application of SEM imaging and deep learning-based techniques for fault or trojan detection is provided. In box 100, a raw SEM image is collected. As shown, SEM layer images are collected and then propagated through a trained deep neural network. The early layers of the network perform the image enhancement task (super-resolution and image stitching, as discussed above). As depicted in Box 104, the output is then passed immediately to a trained single shot detector (SSD) network, which is trained to identify and locate logic cells of interest. The final output of the network is a list of the number and location of each type of logic cell detected (Box 106). This output can be compared to the GDS-II design file (Boxes 108 and 110), which will have the same information. If there is a discrepancy between the output of the network and the design file, it is possible that the IC layer has been tampered with and further investigation is warranted.

As set forth above, a first set of tomographic images is compared to a second set of tomographic images to detect malicious circuit insertions and/or IC design modifications to the integrated circuit. In a variation, an SEM image and ground truth GDS to identify significant differences/trojans. In one refinement, a fully trainable Trojan Scanner is employed. In another variation, an attentive recurrent comparator is utilized. An attentive recurrent comparator is a trained RNN architecture that identifies differences in image pairs. In still another refinement, an image change detection algorithm is used. Image change detection algorithms are a broad class of algorithms that describe how images in a series were changed over time. Traditionally, these algorithms have been used in remote sensing and designed for large-scale images. In one example, images can be compared by a Mean Squared error equation (see, www.pyimagesearch.com/2014/09/15/python-compare-two-images/; the entire disclosure of which is hereby incorporated by reference):

$$MSE = \frac{1}{mn}\sum_{i=0}^{m-1}\sum_{j=0}^{n-1}[I(i,j) - K(i,j)]^2$$

wherein:

I(I,J) is the intensity value at pixel i, j in the design image from design GDS for an integrated circuit layer or layers;

K(I,J) is the intensity value at pixel i, j in the design image from in-line fab metrology data for the integrated circuit layer or layers;

m is the number of pixels in a first direction (i.e., x-direction); and n is the number of pixels in a second direction (i.e., y-direction). Values for the MSE above a predefined threshold value (e.g., greater than 0.1, 0.2, 0.3, etc.) can indicate the presence of malicious circuit insertions and/or IC design modifications. Alternatively, the images can be compared using the Structural Similarity Index described in Zhou Wang, A. C. Bovik, H. R. Sheikh and E. P. Simoncelli, "Image quality assessment: from error visibility to structural similarity," in IEEE Transactions on Image Processing, vol. 13, no. 4, pp. 600-612, April 2004, doi: 10.1109/TIP.2003.819861; the entire disclosure of which is hereby incorporated by reference. When the Structural Similarity Index is used, values less than a predetermined threshold value (e.g., less than 0.95, 0.9, 0.85, 0.8, etc.) can indicate the presence of malicious circuit insertions and/or IC design modifications.

In a variation, transfer learning is applied to the neural networks set forth above. In this technique, the neural network using SEM images is trained on RGB images as the starting point, rather than weights that have been randomly initialized. It has been shown in the literature that transfer learning can be used to retrain a neural network to perform a new task in less time with less data than would be needed to train the network from scratch using randomly initialized weights.

Figure 6:
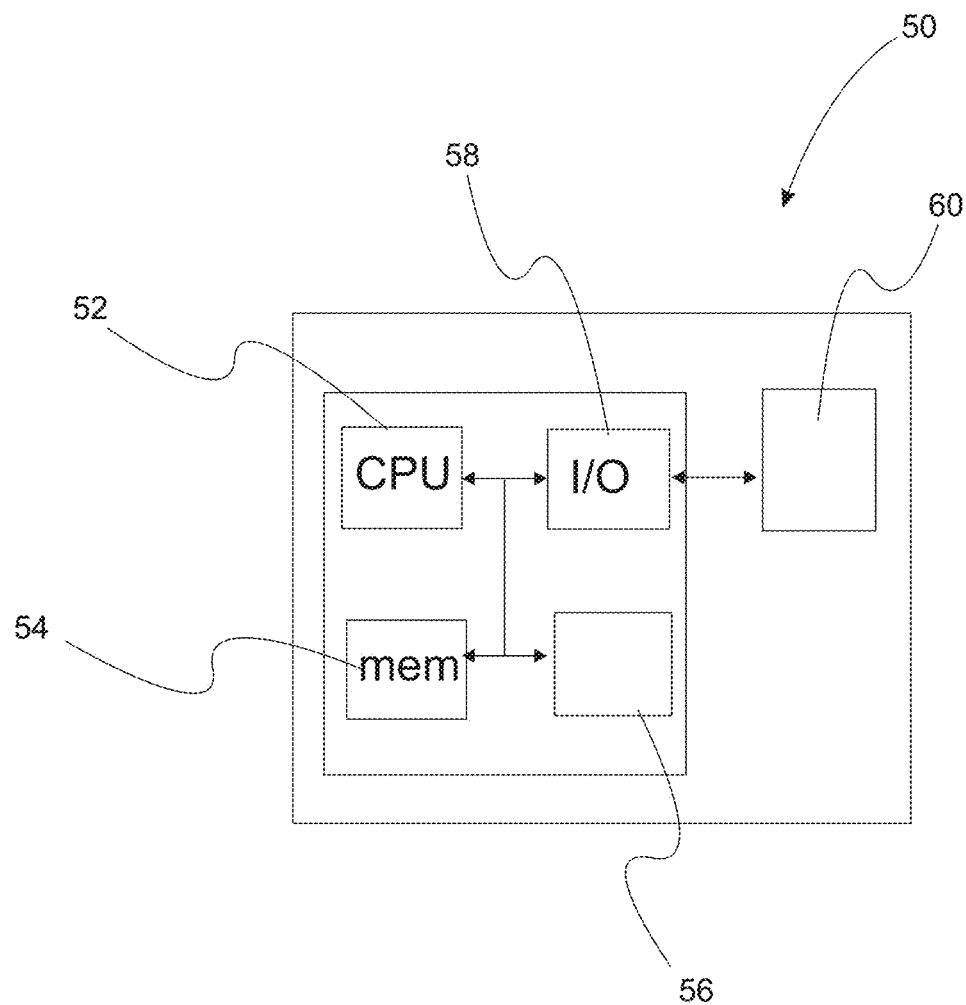
FIG. 6. Schematic illustration of microprocessor system for implementing the methods for detecting hardware Trojans.

With reference to FIG. 6, a schematic illustration of a microprocessor system for implementing the methods set forth above is provided. Microprocessor system 50 is configured to execute steps for constructing a first set of one or more tomographic images constructed from design GDS for an integrated circuit layer or layers and for constructing a second set of one or more tomographic images from in-line fab metrology data for the integrated circuit layer or layers. Characteristically, microprocessor system 50 is configured to execute steps for comparing corresponding images from the first set of tomographic image and the second set of tomographic image to detect malicious circuit insertions and/or IC design modifications to the integrated circuit. Corresponding imaging being images of the same integrated circuit region, wherein the presence of detected malicious circuit insertions and/or IC design are indicated by one or more differences between the corresponding images. Microprocessor system 50 can also be configured to execute the trained neural networks set forth above for identifying malicious circuit insertions and/or IC design modifications. Typically, microprocessor system 50 includes computer processor 52 in communication with random access memory 54. Computer processor 52 executes the machine learning algorithm. Microprocessor system 50 also includes non-transitory memory 56 (e.g., DVD, ROM, hard drive, optical drive, etc.), which can have encoded instruction thereon for the steps executed by computer processor 52. Typically, the executable instructions will be loaded into random access memory 54 from non-transitory memory 56 and then executed by computer processor 52. Microprocessor system 50 also includes input/output interface 58 that can be connected to display 28, keyboard, and mouse. When microprocessor system 50 has been trained as set forth herein, the status of an unknown sample can be evaluated.

Figure 7:
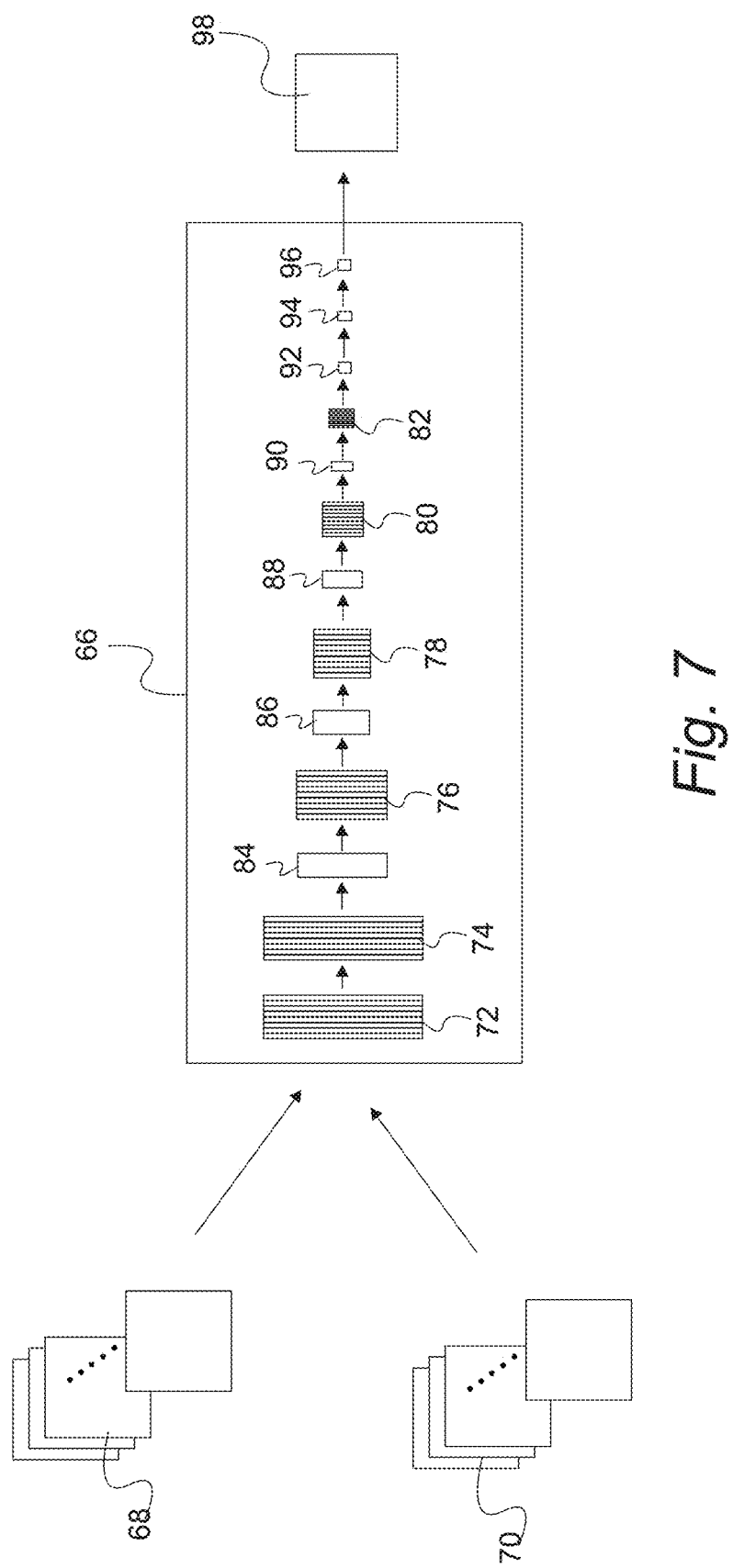
FIG. 7. Idealized schematic illustration of a neural network executed by microprocessor system.

With reference to FIG. 7, an idealized schematic illustration of a neural network executed by microprocessor system 50 is provided. It should be appreciated that any deep neural network that operates on the collected images can be utilized. In a refinement, the neural networks can be convolutional neural networks. The convolutional network can include convolutional layers, pooling layers, fully connected layers, normalization layers, a global mean layer, and a batch-normalization layer. An alternative setup to using the global mean layer is to combine convolutional layers with recurrent neural network layers (for example, a "long-short-term memory layer" (LSTM)), The recurrent neural network layers could perform a similar function to the global mean layer in that they can aggregate information from an arbitrarily large image into a fixed length vector. An example of using recurrent neural nets is the following paper: www.nature.com/articles/s41598-018-21758-3, the entire disclosure of which is hereby incorporated by reference. A global mean layer that takes a feature-wise mean over the entire input matrix results in a fixed-length vector that represents the entire image. Batch normalization, a regularization technique, which may also lead to faster learning. Convolutional neural network layers can be characterized by sparse connectivity where each node in a convolutional layer receives input from only a subset of the nodes in the next lowest neural network layer. The convolutional neural network layers can have nodes that may or may not share weights with other nodes. In contrast, nodes in fully-connected layers receive input from each node in the next lowest neural network layer. For both convolutional layer and fully connected layers each node calculated its output activation from its inputs, weight, and an optional bias. During training, optimal values for the weight and bias of each neuron are determined. For example, convolutional neural network 66 receives a first set of one or more tomographic images 68 constructed from design GDS for an integrated circuit layer or layers and a second set of one or more tomographic images 70 from in-line fab metrology data for the integrated circuit layer or layers. Convolutional neural network 30 include convolution layers 72, 74, 76, 78, 80, and 82 as well as pooling layers 84, 86, 88, 90 and 92. The pooling layers can be max pooling layer or a mean pooling layer. Another option is to use convolutional layers with a stride size greater than 1. FIG. 7 also depicts a network with global mean layer 94 and batch normalization layer 96. Each of the convolution layer can include multiple internal feature maps which can change from layer to layer via subsampling and convolution. The present embodiment is not limited to by number of convolutional layers, pooling layers, fully connected layers, normalization layers, and sublayers therein. The output 98 will typically be an identification of whether or not a malicious circuit insertion and/or IC design modification is present as well as the location of such a malicious circuit insertion and/or IC design modification.

In general, the neural network of FIG. 7 is trained with pairs of 2D and/or 3D images of an image created from the design GDSII file and altered images thereof with an added insertions and/or IC design modifications that can represent a mask swapping and/or mask addition.

The methods provided herein allows interconnects among the layers to be easily visualized, especially in situations where an adversary has altered them (e.g., pin-swapping). The method has the ability to inspect each inter-connected layer and breaking of any interconnects—a possible maliciously induced vulnerability that is quickly accomplished with Focused Ion Beam, which is difficult to be examined using the 2D IC layers. Known techniques such as iterative reconstruction algorithms are practical and feasible for creating a 3D GDS from in-line metrology data. Filtering back projection is a technique that can be employed when information of all layers is available. Otherwise, real space iterative algorithms such as algebraic reconstruction techniques (ART, Simultaneous ART, Simultaneous Iterative ART) can be employed. Equal slope tomography is another technique where both Fourier and real space can be applied based on the available data. Comparison of 3D tomographic images obtained from the circuit layout and SEM metrology layout can be made using tomographic image registration. ML algorithms can also be employed to register tomographic 3D images more quickly using novel learning techniques.

Variations of the present invention provide a sense of assurance to the SRC member companies that no unanticipated or un-attributed alterations of the design were made during the fabrication process. This assurance is made at (1) no additional cost of the wafer processing because in-line metrology data is normally shared with the fabless by the foundry as part of its yield monitoring (2) with no reverse engineering and is a non-destructive technique (3) seamlessly integrated with the manufacturing flow and provides high throughput. This low-cost technique can be seamlessly integrated with the existing fabrication line by the member companies.

In some variations, tools, techniques, and methodologies from the in-line metrology data for validating the taped-out design in the untrusted fab ecosystem are provided. In this regard, it is advantageous to (1) generate 3D tomographic GDS from the circuit design (either leverage open source algorithms or develop specific IPs) and (2) generate 3D tomographic GDS from the in-line metrology data for a particular technology node, and (3) compare the 3D tomographic design images to the 3D tomographic in-line metrology images to detect hardware trojans. These images can be corrected for OPC. The methods may require leveraging in-line metrology data from the foundry (for example: from Intel MPW at 22 or 14 nm preferred).

It should be appreciated that the processes, methods, or algorithms disclosed herein can be deliverable to/implemented by a processing device, controller, or computer, which can include any existing programmable electronic control unit or dedicated electronic control unit. Similarly, the processes, methods, or algorithms can be stored as data and instructions executable by a controller or computer in many forms including, but not limited to, information permanently stored on non-writable storage media such as ROM devices and information alterably stored on writeable storage media such as floppy disks, magnetic tapes, CDs, RAM devices, and other magnetic and optical media. The processes, methods, or algorithms can also be implemented in an executable software object. Alternatively, the processes, methods, or algorithms can be embodied in whole or in part using suitable hardware components, such as Application Specific Integrated Circuits (ASICs), Field-Programmable Gate Arrays (FPGAs), state machines, controllers or other hardware components or devices, or a combination of hardware, software and firmware components.

The following examples illustrate the various embodiments of the present invention. Those skilled in the art will recognize many variations that are within the spirit of the present invention and scope of the claims.

A MATLAB based tool was developed that is able to extract IC layer information from a GDS-II file and use it to generate a *.tiff image of the layer features. Synthetic tomographic IC imagery from the individual layer images was generated by this tool. This is done by taking 2D layer images generated from the MATLAB-based tool and using them to create a volumetric 3D image. During the creation of the 3D image, each individual layer is replicated by a number equal to the layer thickness divided by the volumetric image voxel size. The replicated layer data is then placed in the appropriate space along the z-axis of the volumetric image. Layer thickness and location are provided by foundry PDK data.

As an initial evaluation, using SEM IC imagery from an internal dataset and publicly available pre-trained weights from several published neural networks were designed for super-resolution image enhancement. As mentioned, the internal dataset consists of SEM IC imagery collected at three different image resolutions (1 nm, 4 nm, and 10 nm pixel size) scanned in the same region of the IC. As such, imagery contained the exact same IC features but at different image resolutions. This enabled the image quality of processed images to be compared with images acquired at high resolution. For these tests, we employed the well-established EDSR, ESPCN, FSRCNN, LapSRN, WDSR, and VDSR network architectures were employed. These networks have been demonstrated to enhance the image resolution of RGB images from 2× to 8×, depending on the network architecture. It is important to note that these pre-trained network weights used had been trained using standard RGB photographs rather than SEM imagery.

Results showed that although features were properly upscaled, processed images exhibited artifacts that were not observed in images acquired directly at higher image resolution. It is believed that this is due to neural networks trained to enhance RGB photographs rather than a network trained directly to enhance SEM imagery.

While exemplary embodiments are described above, it is not intended that these embodiments describe all possible forms of the invention. Rather, the words used in the specification are words of description rather than limitation, and it is understood that various changes may be made without departing from the spirit and scope of the invention. Additionally, the features of various implementing embodiments may be combined to form further embodiments of the invention.

What is claimed is:

1. A method for assuring that an integrated circuit is free of malicious circuit insertions and/or IC design modifications, the method comprising:
   constructing a first set of one or more tomographic images constructed from design Geometric Data Stream (GDS) files for one or more layers of an integrated circuit, wherein a high-resolution aspect of the tomographic images facilitates detailed inspection beyond standard imaging resolutions;
   constructing a second set of one or more tomographic images from in-line fab metrology data for the integrated circuit layer or layers, wherein the in-line fab metrology data is critical dimension scanning electron microscopy (CDSEM) data that enhances detection of minute, potentially malicious alterations; and
   comparing corresponding images from the first set of one or more tomographic images and the second set of one or more tomographic images to detect discrepancies indicative of malicious circuit insertions and/or design modifications in the integrated circuit, with such discrepancies being identified as variations in physical structures when compared to the original design specifications, wherein the comparison includes a layer-by-layer analysis for comprehensive coverage of the integrated circuit, and wherein detected discrepancies signify the presence of potential hardware trojan circuits or other unauthorized modifications, thereby ensuring the integrity and security of the integrated circuit, the method further comprising:
   a) obtaining in-line fabrication metrology data contemporaneously with a manufacturing process of the integrated circuit, thereby ensuring real-time detection and assessment of any potential malicious insertions or design modifications;
   b) utilizing metrological techniques, including high-precision scanning electron microscopy, to capture detailed and accurate representations of the integrated circuit at various stages of its fabrication;
   c) implementing a continuous monitoring protocol where metrology data is systematically collected and analyzed at predetermined intervals throughout the fabrication process, thereby allowing for early detection and mitigation of any unauthorized alterations or insertions; and
   d) ensuring that the metrology data encompasses a comprehensive range of physical dimensions and electrical properties relevant to the integrity and functionality of the integrated circuit, including layer thickness, doping concentrations, and electrical connectivity, wherein this comprehensive and real-time approach to collecting and analyzing metrology data provides a framework for safeguarding against incorporation of hardware trojans and other malicious modifications during the manufacturing process.

2. The method of claim 1 wherein the in-line fab metrology data is acquired during manufacturing of the integrated circuit.

3. The method of claim 1 wherein mask swapping and/or mask addition is created by malicious circuit insertions and/or IC design modifications.

4. The method of claim 1 wherein the first set of one or more tomographic images and the second set of one or more tomographic images are 2D images.

5. The method of claim 1 wherein the first set of one or more tomographic images and the second set of one or more tomographic images are 3D images.

6. The method of claim 1, wherein during each step of IC fabrication flow, several in-line metrology measurements are taken layer-by-layer and used to create 2D tomographic images of each IC layer.

7. The method of claim 6, wherein a 3D composite tomographic image of an entire IC is formed from the 2D tomographic images.

8. The method of claim 7, wherein an OPC-modified GDS file of the entire IC is constructed from metrology measurements.

9. The method of claim 7, wherein an OPC-modified GDS file of a specific layer in an IC is constructed from metrology measurements.

10. The method of claim 7, wherein a wafer is accepted if the 3D composite tomographic image 2D and/or 3D tomographic images constructed from design GDS match the 2D and/or 3D tomographic images constructed from the in-line fab metrology data.

11. The method of claim 7, wherein the composite 3D tomographic image enhances visualization for all IC layers and their routing.

12. The method of claim 7, wherein the composite 3D tomographic image facilitates detailed examination of a suspicious area-of-interest.

13. The method of claim 1 wherein machine learning algorithms are applied to register tomographic 3D images.

14. The method of claim 1 wherein the resolution for images in the first set of one or more tomographic images and/or images in the second set of one or more tomographic images are upscaled.

15. The method of claim 1 wherein the resolution for images in the first set of one or more tomographic images and/or images in the second set of one or more tomographic images are upscaled by a trained neural network.

16. The method of claim 1 wherein missing regions in images in the first set of one or more tomographic images and/or images in the second set of one or more tomographic images are filled in by a trained neural network.

* * * * *